United States Patent [19]

Cloke

[11] Patent Number: 4,697,098
[45] Date of Patent: Sep. 29, 1987

[54] COMPOSITE GATE GENERATOR CIRCUIT FOR DETECTING VALID DATA SIGNALS

[75] Inventor: Robert L. Cloke, Santa Clara, Calif.

[73] Assignee: Priam Corporation, San Jose, Calif.

[21] Appl. No.: 743,037

[22] Filed: Jun. 10, 1985

[51] Int. Cl.[4] .................... H03K 5/153; H04B 1/110
[52] U.S. Cl. .................................. 307/354; 307/362;
328/116; 328/147; 328/149; 328/163; 360/53;
375/104
[58] Field of Search .............. 328/162, 163, 146, 147,
328/149, 115, 116, 117, 118; 307/354, 362;
375/104; 360/53

[56] References Cited

U.S. PATENT DOCUMENTS

| 3,413,412 | 11/1968 | Townsend | 315/104 |
|---|---|---|---|
| 3,493,877 | 2/1970 | Jacobson | 307/354 |
| 3,693,028 | 9/1972 | Fussell | 328/117 |
| 3,965,428 | 6/1976 | Katz et al. | 328/147 |
| 4,135,161 | 1/1979 | Torrieri | 328/108 |

FOREIGN PATENT DOCUMENTS

| 0027547 | 4/1981 | European Pat. Off. | |
| 0126860 | 10/1980 | Japan | 307/354 |
| 976346 | 11/1964 | United Kingdom | |
| 1599459 | 10/1981 | United Kingdom | |

Primary Examiner—Stanley D. Miller
Assistant Examiner—Trong Quang Phan
Attorney, Agent, or Firm—Flehr, Hohbach, Test, Albritton & Herbert

[57] ABSTRACT

A gate generator useful for validating readout signals incorporates three channels, including differentiators and threshold comparators, and a logic circuit coupled to the output circuits of the channels for passing valid readout signals. The output signals of the comparators and of detected zero crossings derived from a differentiated signal are fed to the logic circuit for processing.

7 Claims, 19 Drawing Figures

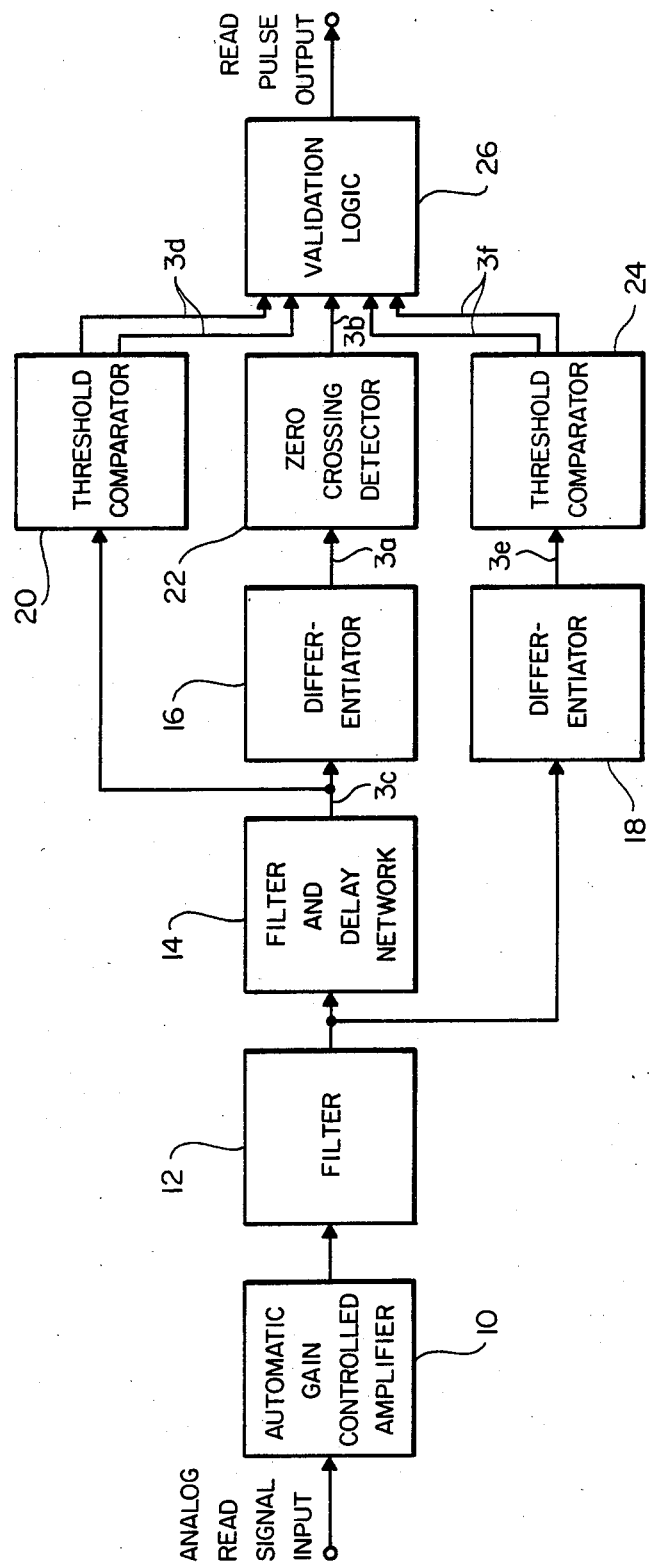
FIG_1

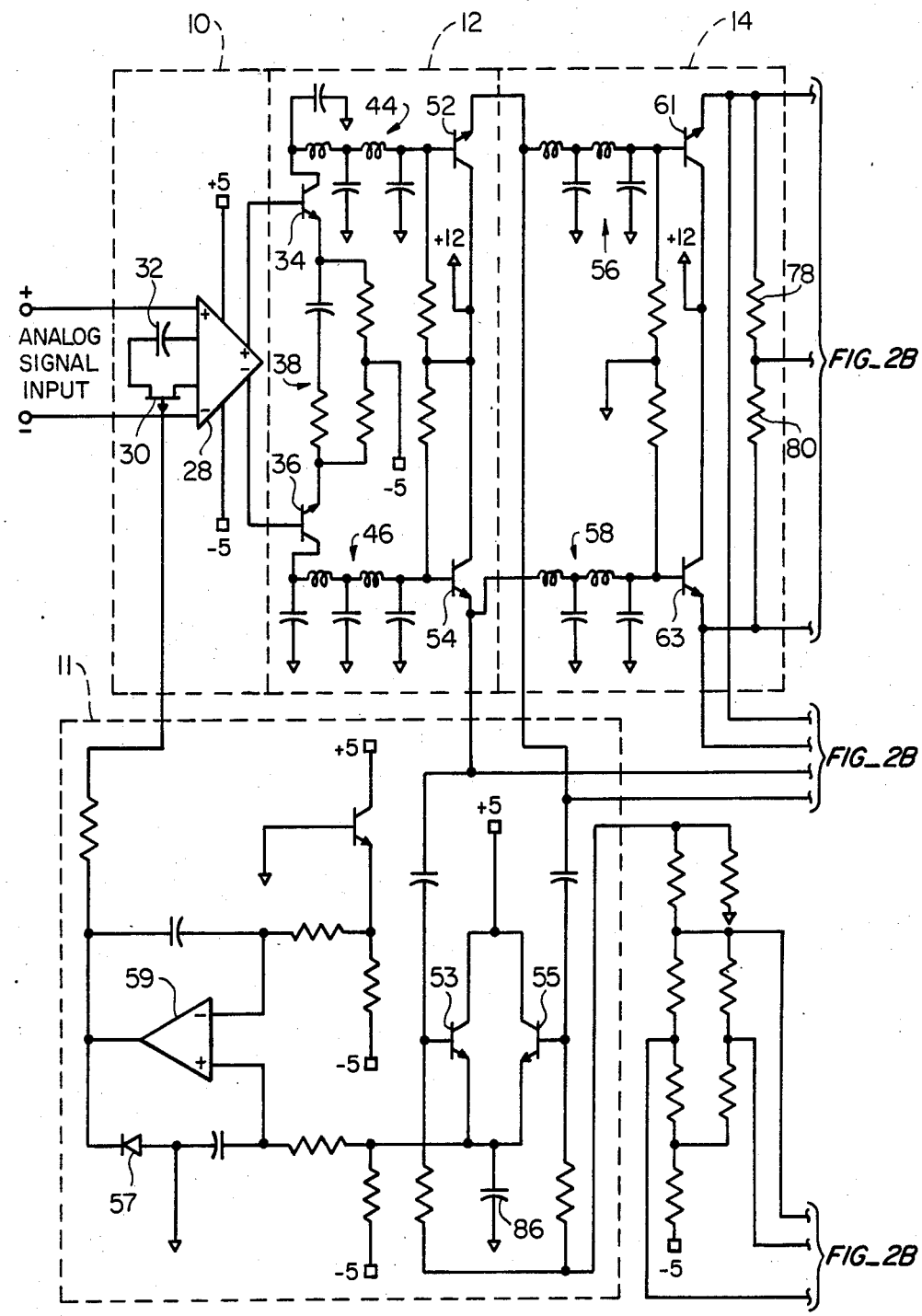
FIG_2A

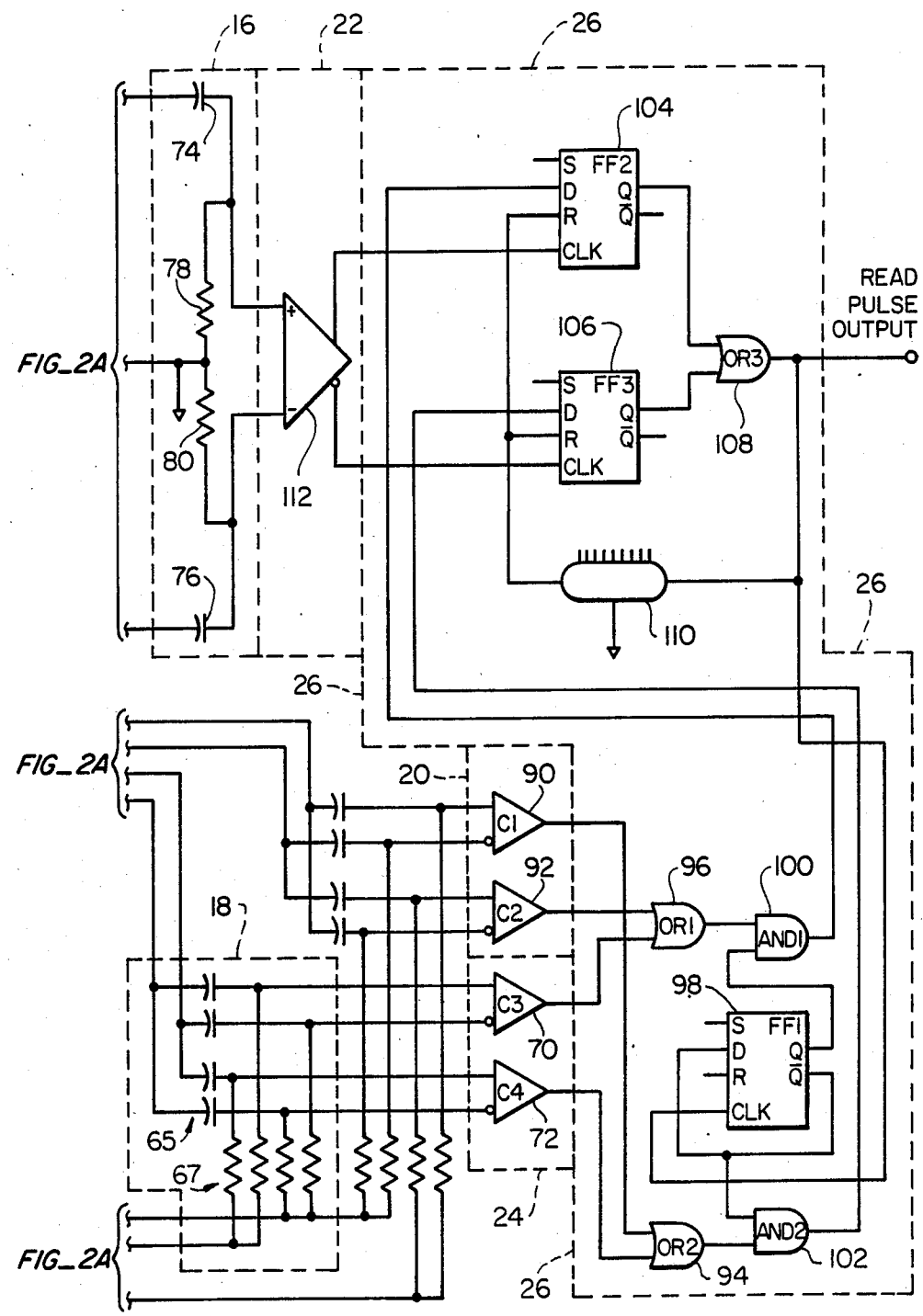
FIG_2B

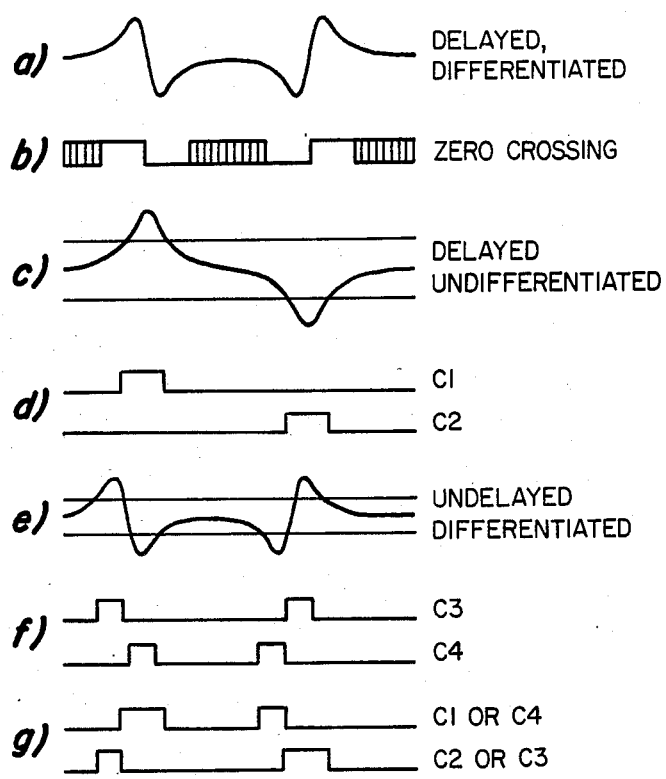
FIG_3
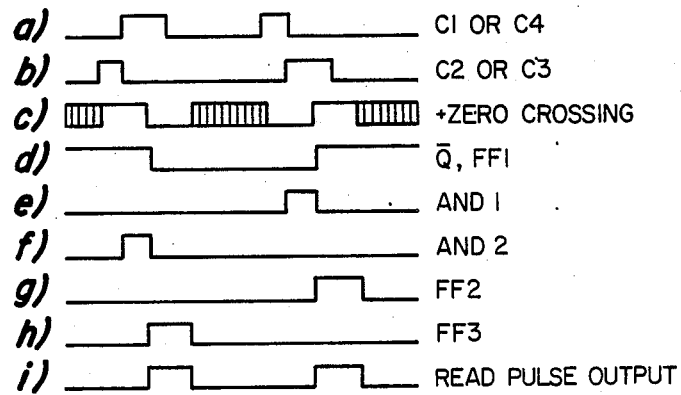
FIG_4

COMPOSITE GATE GENERATOR CIRCUIT FOR DETECTING VALID DATA SIGNALS

DESCRIPTION

Technical Field

This invention relates to a gate generator circuit, and in particular to a readout circuit for detecting valid data signals.

BACKGROUND OF THE INVENTION

In data readout systems, such as utilized with disk drives for example, data bits are preferably closely packed on the storage medium during recording in order to achieve high density storage. A conventional approach for detecting the recorded data signal is by sensing the peaks of the data bits which appear within allotted time cells or positions. However, during readout detection of the recorded signal, errors arise due to noise, interference and dropouts, among other things, particularly more so when recorded bits are closely packed and the time cells for recognizing valid signals are relatively narrow.

In virtually all peak-position detection systems of this type, the readout signal is differentiated to change a peak into a zero crossing. The differentiated signal is applied to a voltage comparator that acts as a zero crossing detector, thereby producing a sharp transition at its output whenever the input signal passes through zero.

One problem that arises with a zero crossing detector of this type is that if the input signal returns to the baseline between peaks, the differentiated signal will return to zero. However, since the input signal has been differentiated, there will be considerable noise on its baseline. This noise results in many extraneous zero crossings which are not derived from a valid peak of the input signal.

In readout systems for sensing data bits which have been stored on a magnetic medium for example, amplitude threshold detection of the input signal is often employed for validating zero crossing data signals. Amplitude threshold detection may be accomplished by processing the differentiated input signal or by using the undifferentiated signal at the input to a threshold detector. The application of a threshold to the undifferentiated signal works well for signals having wide spacing between peaks, and thus experiences very little inter-symbol-interference. However, where the data bits are closely spaced and there is substantial inter-symbol-interfernce, the amplitude of the closely spaced peaks of the undifferentiated signal will result in the threshold detector becoming sensitive to small variations in the signal amplitude.

In contrast when inter-symbol-interference occurs in the differentiated signal, the amplitude at the point of interference tends to increase, so that applying the differentiated signal to the threshold detector results in improved performance for closely spaced data bits. However, the system experiences problems qualifying isolated data bits, particularly if the pulses are poorly shaped, such as unwanted shoulders found with some pulses, due to a defect on the magnetic recording medium.

SUMMARY OF THE INVENTION

An object of this invention is to provide an improved circuit and method for detecting high density recorded data bits.

In accordance with this invention, a gate generator circuit employs a plurality of threshold comparators connected in parallel in separate channels. An input data signal is passed through a filtering and delay network. The filtered signal is applied to a first threshold comparator without differentiation, and to a second threshold comparator after differentiation. The outputs of the threshold comparators are fed together with detected zero crossings derived from a differentiated signal to a logic circuit for validation of the output read signal.

BRIEF DESCRIPTION OF THE DRAWING

The invention will be described in detail with reference to the drawing in which:

FIG. 1 is a block circuit diagram of the novel circuit of this invention;

FIGS. 2A and 2B is a schematic circuit diagram of the novel circuit of this invention as illustrated in FIG. 1;

FIGS. 3a–g are a series of waveforms relating to signals processed through the circuits of FIGS. 1 and 2; and FIGS. 4a–g are a series of waveforms relating to the circuit of FIG. 2.

DESCRIPTION OF THE PREFERRED EMBODIMENT

With reference to FIG. 1, an analog read data signal is applied to the input of an automatic gain controlled (AGC) amplifier 10, which amplifies the input signal to a fixed reference amplitude. The amplified signal is directed through a low pass filter 12 which eliminates high frequency noise. The filtered signal is passed to a network 14 which includes a low pass filter and delay circuit, and to a differentiator 18. The delayed undifferentiated signal (FIG. 3c) is provided to a second differentiator 16, and the differentiated, delayed output (FIG. 3a) is passed to a zero crossing detector 22 which provides a transition (FIG. 3b) for each zero crossing of the delayed differentiated signal. The differentiator 16 and zero crossing detector 22 are part of a timing channel.

The undifferentiated delayed signal (FIG. 3c) is also is directed to a threshold comparator 20 which compares both positive and negative inputs to a predetermined threshold voltage, and produces two separate output signals C1 and C2 (FIG. 3d) representing the positive and negative peaks of the undifferentiated delayed signal respectively.

The differentiated undelayed output signal (FIG. 3e) from the differentiator 18 is applied to a threshold comparator 24, which compares both positive and negative inputs to a second predetermined threshold voltage, and produces output signals C3 and C4 (FIG. 3f) representing the positive and negative peaks of the differentiated undelayed signal respectively.

Threshold comparator 20, differentiator 18 and threshold comparator 24 form the gate generator channel.

The output signal from the zero crossing detector 22, threshold comparator 20, and threshold comparator 24 are fed to the validation logic circuit 26 for passing only valid data signals to an output circuit for utilization.

In the schematic circuit of FIG. 2, which delineates the components of the block circuit of FIG. 1, the AGC amplifier 10 receives positive and negative analog signals which are applied to the input of an amplifier 28. The amplifier 28 is controlled by a feedback loop which includes the low pass filter 12 and an AGC control circuit 11. The amplified signals from amplifier 28 is passed through transistors 34 and 36 which are connected by an RC circuit 38. The transistors 34 and 36 are respectively connected to LC sections 44 and 46 which form a ladder network. The amplified signals that pass through the ladder network are received by differentially connected emitter follower transistors 52 and 54, and then are directed to a typical AGC control circuit 11, which includes a peak-hold capacitor 86 connected by NPN transistors 53 and 55 to operate as a positive-peak hold circuit, and amplifier 59. The output of amplifier 59 is connected to a field-effect transistor 30, and to a diode 57, the purpose of which is to prevent negative excursions of the output of amplifier 59 which may cause undesirable forward biasing of the gate of the field-effect transistor 30.

The filtered signal from filter 12 is also directed to a low pass filter and delay 14 and to the differentiator 18. The filter and delay circuit 14 includes a ladder network with LC sections 56 and 58, and emitter followers 61 and 63 to provide isolation of the threshold and zero crossing detector loads. The differentiator 18 includes four capacitors 65 connected respectively to four resistors 67, and acts as part of the gate generator in conjunction with the threshold comparator 24, formed by comparator circuits 70 and 72. The undelayed and differentiated signal is compared by comparators 70 and 72 to qualify the signal for validation by the logic circuit 26.

The filtered and delayed signals appearing at the output of transistors 61 and 63 are fed to the differentiator 16 formed by capacitors 74 and 76 which are connected to a grounded resistive network, comprising resistances 78 and 80. The delayed and differentiated signal is processed by zero crossing detector 22 which converts the signal to digital form that is passed to logic circuit 26. Those zero crossing signal transitions (FIG. 3b) which are valid will be approximately time coincident with the center of the positive pulse of C1 (for negative transitions) or C2 (for positive transitions) from threshold comparator 20, and will also be approximately time coincident with the center of the positive pulses C4 or C3, respectively, from threshold comparator 24, due to the delay introduced in the undifferentiated delayed, and differentiated delayed signal paths by filter and delay 14.

The filtered and delayed signals are applied to threshold comparator 20, made up of comparators 90 and 92 which compare the positive and negative going undifferentiated peaks to a fixed threshold. The undifferentiated peaks are of standard amplitude after processing by the AGC circuit. Comparators 70 and 72 compare the differentiated signal resulting from the negative and positive peaks to a second fixed threshold. The outputs from comparator 90 and comparator 72 are applied to the OR gate 94 and the outputs from the comparators 70 and 92 are supplied to the OR gate 96. As a result, the zero crossing signal is qualified by either the undifferentiated or differentiated signal crossing its threshold, or both, provided that the threshold crossing has the correct polarity. Due to the presence of the OR gates 94 and 96, the threshold levels can be made larger in magnitude than that utilized in a single threshold system, and thus immunity to noise at the baseline is gained.

The validation logic circuit 26 includes a flip-flop 98 which requires that qualified zero crossings be of opposite polarities. This allows elimination of the qualification of invalid zero crossings by the first lobe of the differentiated signal of an upcoming valid zero crossing. The first lobe of the differentiated signal is of the same polarity as the second lobe of the prior zero crossing. The flip-flop 98 also eliminates validation of multiple zero crossings in response to a single qualification gate.

The flip-flop 98 provides a signal to AND gate 100 or AND gate 102 depending upon its state. The AND gates 100 and 102 are enabled by signals respectively from OR gate 96 or OR gate 94. The output from AND gate 100 is a positive zero crossing qualifier signal that is directed to the flip-flop 104. The AND gate 102 provides a negative zero crossing qualifier signal to the flip-flop 106.

An output signal is applied to the OR logic gate 108 from the flip-flops 104 or 106 when the output signals from the voltage comparator 112 of the zero crossing detector 22, and the qualified positive or negative signals applied to the flip-flops are in synchronism. The delay line 110, which may be an RC timing circuit, propagates the output pulse back to the reset terminal of both flip-flops 104 and 106 to truncate the output pulse to a standard length, and to reset the flip-flops to their initial state to be ready for another valid zero crossing. OR gates 94, 96 and 108 are preferably wired/OR implementations so that components are saved and timing is improved.

By virtue of the novel circuit of this invention, a stream of digital output pulses are generated wherein the phase or position and time of the leading edge of each pulse represents the time of occurrence of a valid peak of the input analog waveform. The validation of the peaks of the read signals being processed results in a significant improvement in rejection of noise and dropouts. Application of the differentiated signal in addition to the undifferentiated signal to the threshold detector results in improved performance for closely and widely spaced data signals. As the sensitivities of the two channels which include the threshold detectors are complementary, both thresholds can be raised in value to provide additional immunity to baseline noise without incurring a troublesome sensitivity to low amplitude signals for either closely or widely spaced signal peaks.

It should be noted that the invention is not necessarily limited to disk drive systems or magnetic recording, but is applicable to other systems wherein analog waveforms are processed.

What is claimed is:

1. A gate generator circuit for validating and passing valid readout signals to an output utilization circuit comprising:
   a source of input signals;
   filtering means coupled to said source for filtering said input signals;
   a first channel comprising:
      a first differentiator means coupled to said filtering means for differentiating the filtered signal; and
      a first threshold comparator coupled to said first differentiator means for comparing the differentiated signal from said first differentiator means to a fixed reference voltage;
   a second channel comprising:

a second threshold comparator coupled to said filtering means for comparing an undifferentiated signal to a selected fixed reference voltage;

a third channel comprising:
- a second differentiator means coupled to said filtering means for differentiating the filtered signal; and
- a zero crossing detector coupled to said second differentiator means; and a logic circuit coupled to said three channels for passing only valid readout signals.

2. A gate generator circuit as in claim 1, including delaying means coupled to said source of input signals for delaying said input signals, said delaying means connected to said second and third channels.

3. A gate generator circuit as in claim 2, wherein said first threshold comparator compares an undelayed and differentiated signal to a first reference voltage and said second threshold comparator compares a delayed and undifferentiated signal to a second reference voltage.

4. A gate generator circuit as in claim 1, including a gain control amplifier coupled between said source of input signals and said filtering means.

5. A gate generator circuit as in claim 4, including a control circuit coupled to the output and input of said gain control amplifier in a closed feedback loop.

6. A gate generator circuit as in claim 1, wherein said logic circuit includes a flip-flop circuit for processing zero crossing signals of opposite polarities.

7. A gate generator circuit as in claim 6, wherein said logic circuit comprises first and second flip-flops, said first flip-flop receiving positive zero crossing signals and said second flip-flop receiving negative zero crossing signals for passing positive and negative signals respectively received from said threshold comparators.

* * * * *